(12) United States Patent
Tanizaki et al.

(10) Patent No.: US 6,728,122 B2
(45) Date of Patent: Apr. 27, 2004

(54) SEMICONDUCTOR MEMORY DEVICE CAPABLE OF REWRITING DATA SIGNAL

(75) Inventors: Hiroaki Tanizaki, Hyogo (JP); Tsukasa Ooishi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 4 days.

(21) Appl. No.: 10/138,266

(22) Filed: May 6, 2002

(65) Prior Publication Data

US 2003/0058727 A1 Mar. 27, 2003

(30) Foreign Application Priority Data

Sep. 21, 2001 (JP) ........................................ 2001-289315

(51) Int. Cl.[7] .................................................. G11C 8/00
(52) U.S. Cl. ................. 365/3; 365/230.06; 365/230.08; 365/189.01; 365/191
(58) Field of Search ........................ 365/230.03, 230.01, 365/230.06, 230.08, 189.01, 191

(56) References Cited

U.S. PATENT DOCUMENTS

| 4,984,206 A | | 1/1991 | Komatsu et al. |
| 6,038,186 A | * | 3/2000 | Tanizaki ...................... 365/222 |
| 6,349,054 B1 | * | 2/2002 | Hidaka ........................ 365/173 |

OTHER PUBLICATIONS

"Ultra LSI Memory", Kiyoo Ito, Advanced Electronics Series, I–9, Baifukan, Apr. 10, 1997, pp. 161–175.

* cited by examiner

*Primary Examiner*—David Nelms
*Assistant Examiner*—Long Tran
(74) *Attorney, Agent, or Firm*—McDermott, Will & Emery

(57) ABSTRACT

In DRAM, a bit line pair are connected to the respective gates of an N channel MOS transistor pair of a read gate, and a write data line pair are connected to the respective gates of an N channel MOS transistor pair of a write gate. Therefore, since neither of the read data line pair and the write data line pair is directly connected to the bit line pair, no data signal on the bit line pair is destroyed by noise occurring on the read data line pair and the write data line pair.

7 Claims, 15 Drawing Sheets

SEMICONDUCTOR MEMORY DEVICE CAPABLE OF REWRITING DATA SIGNAL

BACKGROUND OF THE INVENTION

1. Field of the Invention

The present invention relates to a semiconductor memory device, and particularly, to a semiconductor memory device capable of rewriting a data signal.

2. Description of the Background of Art

FIG. 20 is a circuit block diagram showing a main section of a prior art dynamic random access memory (hereinafter referred to as DRAM).

In FIG. 20, this DRAM has two memory cell arrays MA1 and MA2. Each of memory cell arrays MA1 and MA2 includes memory cells MC located at respective intersections between word lines WL and bit line pairs BL and /BL. Memory cell MC stores one data signal thereon.

Bit line equalize circuits 82 and 83 are provided to bit line pairs BL and /BL of respective memory cell arrays MA1 and MA2. Bit line equalize circuits 82 and 83 are activated in response to transition of respective bit line equalize signals BLEQL and BLEQR to L level, which is an active level, to precharge corresponding bit line pair BL and /BL to bit line precharge potential VBL (=VCC/2).

A transfer gate 80 is provided between a pair of bit lines BL and /BL of memory cell array MA1 and a pair of nodes N81 and N82; and a transfer gate 81 is provided between a pair of bit lines BL and /BL of memory cell array MA2 and a pair of nodes N81 and N82. Transfer gates 80 and 81 become non-conductive in response to transition of signals BLIL and BLIR to L level.

Nodes N81 and N82 are connected to a sense amplifier 84. Sense amplifier 84 is activated in response to transition of sense amplifier activation signals SE and /SE to H level and L level, respectively, to amplify a small potential difference occurring between nodes N81 and N82 to power supply voltage VCC. Nodes N81 and N82 are connected to one ends of global IO lines GIO and /GIO through a column select gate 85. Column select gate 85 becomes conductive in response to transition of a corresponding column select line CSL to H level, which is a select level.

A GIO line equalize circuit 86, a read amplifier 87 and a write driver 88 are connected to the other ends of global 10 line pair GIO and /GIO. GIO line equalize circuit 86 is activated in response to transition of GIO line equalize signal GIOEQ to L level, which is an active level, to precharge global IO lines GIO and /GIO to power supply potential VCC. Read amplifier 87 is activated in response to transition of a signal PAE to H level, which is an active level, to compare potentials of global lines GIO and /GIO in magnitude with each other and to output a read data signal RD at a logical level corresponding to a result of the comparison.

Write driver 88 is activated in response to transition of a write driver activation signal WDE to H level, which is an active level, to drive one of global IO lines GIO and /GIO to H level and in addition, the other to L level according to a logical level of a write data signal WD.

That is, write driver 88, as shown in FIG. 21, includes: NAND gates 91 and 92; inverters 93 to 97; P channel MOS transistors 98 and 99; and N channel MOS transistors 100 and 101. P channel MOS transistors 98 and 99 are connected between power supply potential VCC line and each of respective global lines GIO and /GIO; and N channel MOS transistors 100 and 101 are connected between each of respective global IO lines GIO and /GIO and ground potential GND line.

Write driver activation signal WDE is inputted to one input nodes of NAND gates 91 and 92. Write data signal WD is inputted directly to the other input node of NAND gate 91 and in addition, to the other input node of NAND gate 92 through inverter 93. An output signal of NAND gate 91 is inputted to the gate of P channel MOS transistor 98 through inverters 94 and 95, and in addition, to the gate of N channel MOS transistor 101 through inverter 94. An output signal of NAND gate 92 is inputted to the gate of N channel MOS transistor 100 through inverter 95 and in addition, to the gate of P channel MOS transistor 99 through inverters 96 and 97.

In write operation and in a case where no rewriting of data is inhibited by a write mask signal, write driver activation signal WD is driven to H level, which is an active level, and NAND gates 91 and 92 operate as inverters. In a case where write data signal WD is at H level, MOS transistors 98 and 101 become conductive and in addition, MOS transistors 99 and 100 become non-conductive, and global IO lines GIO and /GIO are driven to H level and L level, respectively. In a case where write data signal WD is at L level, MOS transistors 99 and 100 become conductive and in addition, MOS transistors 98 and 101 become non-conductive, and global lines GIO and /GIO are driven to L level and H level, respectively.

Then, description will be given of an operation of DRAM shown in FIGS. 20 and 21. Note that of memory cell arrays MA1 and MA2, memory cell array MA1 is selected.

In write operation, bit line equalize signal BLEQL is first raised to H level to deactivate bit line equalize circuit 82 and in addition, array select signal BLIR is driven to L level to cause transfer gate 81 to be non-conductive. Then, word line WL is driven to H level, which is a select level, to activate memory cell MC and a small potential difference occurs between bit line pair BL and /BL according to stored data on memory cell MC.

Then, sense amplifier activation signals SE and /SE are driven to H level and L level, respectively, to activate sense amplifier 84; and one bit line (for example, BL) is driven to H level and in addition, the other bit line (/BL in this case) is driven to L level. Subsequently, GIO line equalize signal GIOEQ is driven to H level, which is an inactive level, and GIO line equalize circuit 86 is deactivated to cease equalization of global IO lines GIO and /GIO.

Then column select line CSL is raised to H level, which is a select level, to cause column gate 85 to be conductive and potentials of bit lines BL and /BL are transmitted to respective global IO lines GIO and /GIO. Read amplifier 87 is activated in response to transition of signal PAE to H level, which is an active level, to compare potentials of global IO lines GIO and /GIO in magnitude and to output read data signal RD at a logical level corresponding to a result of the comparison.

In write operation, similar to a read operation, bit line equalize circuit 82 is deactivated, transfer gate 81 is caused to be non-conductive, sense amplifier 84 is activated to drive one bit line to H level and in addition, the other bit line to L level, and GIO line equalize circuit 86 is deactivated to cease equalization of global IO line pair GIO and /GIO.

Then, write driver activation signal WDE is driven to H level, which is an active level, to activate write driver 88; and one of global IO lines GIO and /GIO is driven to H level, and the other is driven to L level according to a logical level of write data signal WD. Subsequently, column select line CSL is driven to H level, which is a select level, to cause column select gate 85 to be conductive and potentials of global IO lines GIO and /GIO are transmitted to bit lines BL and /BL to write a potential of a bit line (BL in the figure) onto memory cell MC.

In a prior art DRAM, however, bit line pair BL and /BL and global IO line pair GIO and /GIO are connected directly to each other through column select gate 85; therefore, there has been a problem that in a case where precharge of global 10 line pair GIO and /GIO is incomplete, or in a case where noise occurs on global IO line pair GIO and /GIO by interference from other wirings, a data signal read-out onto bit line pair BL and /BL is destroyed. Although there is a method to enhance a current drive ability of sense amplifier 84 as a measure to prevent a data signal read-out onto bit line pair BL and /BL from being destroyed, a problem of increase in a layout area of sense amplifier 84 still remains.

Furthermore, since there has been a necessity for precharge of global IO lines GIO and /GIO performed each time data signal WD is written onto memory cell MC, a time for precharge is necessary, having lead to difficulty in realization of a high speed write operation.

Moreover, in a case where write mask operation is performed, since global IO lines GIO and /GIO are precharged to H level and thereafter, column select gate 85 is caused to be conductive, a current flows out from global IO line GIO or /GIO, whichever has been driven to H level, to bit line BL or /BL, whichever has been driven to L level, having resulted in useless consumption of the current.

SUMMARY OF THE INVENTION

Therefore, it is a main object of the present invention to provide a semiconductor memory devices, strong in noise resistance, fast in write operation and low in consumed current.

A semiconductor memory device includes: a memory block including plural memory cells, plural word lines and plural bit line pairs; a sense amplifier amplifying a potential difference occurring between a bit line pair; a row decoder selecting one word line of the plural word lines according to a row address signal; a column decoder selecting one bit line of the plural bit line pairs according to a column address signal; a read data line pair; a write data line pair; a read circuit connected to one ends of the read data line pair; a write circuit connected to one ends of the write data line pair; and an input/output control circuit, coupling a bit line pair selected by the column decoder and the other ends of the read data line pair with each other in read operation, and coupling a bit line pair selected by the column decoder and the other ends of the write data pair with each other in write operation. The input/output control circuit includes: first and second transistors provided to each bit line pair, and whose input electrodes are connected to first and second bit lines, respectively, included in a corresponding bit line pair; a first switch circuit, provided to each bit line pair, and connecting corresponding first and second transistors between each of first and second read data lines, respectively, included in the read data line pair and a line of a first reference potential in response to selection of a corresponding bit line pair by the column decoder in read operation; third and fourth transistors, provided to each bit line pair, and whose input electrodes are connected to first and second write data lines, respectively, included in the write data line pair; and a second switch circuit, provided to each bit line pair, and connecting corresponding third and fourth transistors between each of first and second bit lines, respectively, included in a corresponding bit line pair and a line of a second reference potential in response to selection of a corresponding bit line pair by the column decoder in write operation. Therefore, in write operation, since a bit line pair and the read data line pair are connected indirectly to each other through the input electrodes of the first and second transistors, no data read-out onto the bit line pair is destroyed even in a case where noise occurs on the read data line pair in read operation. Moreover, in write operation, since input potentials of the third and fourth electrodes are controlled through the write data line pair, there is no necessity for precharging of the write data line pair to power supply potential. Accordingly, a high speed write operation can be realized.

Preferably, the first and second transistors are each an N channel MOS transistor and the first reference potential is ground potential. In this case, the first or second transistor corresponding to a bit line on the power supply potential side of the first and second bit lines becomes conductive, and the first or second read data line corresponding to the first or second transistor whichever has become conductive is driven to ground potential.

Preferably, the read circuit includes: a precharge circuit charging the first and second read data lines to power supply potential in advance; and a read amplifier comparing potentials of the first and second read data lines in magnitude to output a data signal at a logical level corresponding to a result of the comparison. In this case, the read circuit can be constructed with ease.

Preferably, the third and fourth transistors are each an N channel MOS transistor and the second reference potential is ground potential. In this case, the third or fourth transistor corresponding to a write data line on the power supply potential side of the first and second read data lines becomes conductive, and the first or second bit line corresponding to the third or fourth transistor whichever has become conductive is driven to ground potential.

Preferably, the write circuit drives one write data line of first and second write data lines to power supply potential and the other write data line to ground potential, according to a logical level of a write data signal; and drives both of the first and second write data lines to ground potential in write mask mode in which rewriting of data is inhibited. In this case, since no current flows out from a bit line pair and the read data line pair in write mask mode, a consumed current remains small in magnitude.

Preferably, the third and fourth transistors are each a P channel MOS transistor and the second reference potential is power supply potential. In this case, the third or fourth transistor corresponding to a read data line on the ground potential side of the first and second read data lines becomes conductive, and the first or second bit line corresponding to the third or fourth transistor whichever has become conductive is driven to power supply potential.

Preferably, the write circuit drives one write data line of the first and second write data lines to power supply potential and the other write data line to ground potential, according to a logical level of a write data signal; and drives both of the first and second write data lines to power supply potential in write mask mode in which rewriting of data is inhibited. In this case, since no current flows out from a bit line pair and the read data line pair in write mask mode, a consumed current remains small in magnitude.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
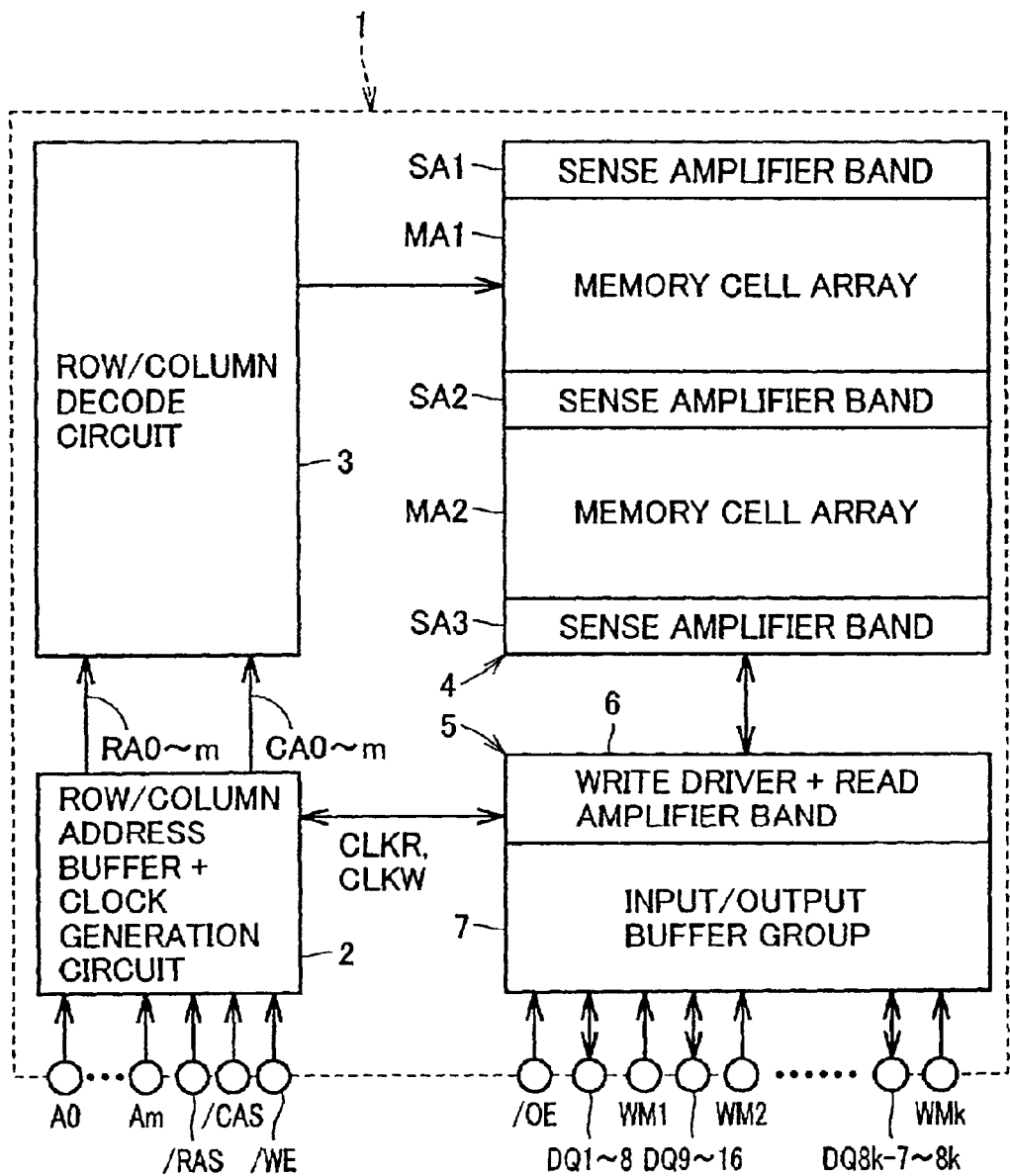
FIG. 1 is a block diagram showing the entire configuration of DRAM according to a first embodiment of the present invention.

FIG. 1 is a block diagram showing the entire configuration of DRAM according to a first embodiment of the present invention. In FIG. 1, this DRAM includes: a row/column address buffer+clock generation circuit 2; a row/column decode circuit 3; a memory mat 4 and a data input/output circuit 5. In this DRAM 1, inputting/outputting of 8 k data signals DQ1 to DQ8 (wherein k is an integer 1 or more) are simultaneously enabled and the input terminal for one write mask signal WM is provided for every 8 data signals.

Row address signals RA0 to Ram, column address signals CA0 to CAm, a read clock signal CLKR and a write clock signal CLKW are produced in the row/column address buffer+clock generation circuit according to external address signals A0 to Am (wherein m is an integer of 0 or more) and external control signals /RAS and /CAS and /WE to control the entire DRAM 1.

Memory mat 4 includes: plural (3 in the figure) sense amplifier bands SA1 to SA3; memory cell arrays MA1 and MA2, each disposed between sense amplifier bands SA1 to SA2. Memory cell arrays MA1 and MA2 each includes plural memory cells each storing one data signal thereon. The plural memory cells are divided into groups each having 8k cells therein, wherein the 8 k is a predetermined number. The memory cell groups are each disposed at a prescribed address to be determined by a row address and a column address.

Row/column decode circuit 3 specifies an address in memory cell array MA1 or MA2 according to row address signal RA0 to RAm and column address signal CA0 to CAm provided from row/column address buffer+clock generation circuit 2. A sense amplifier+input/output control circuit group described later is provided in each of sense amplifier bands SA1 and SA2. The sense amplifier+input/output control circuit group connects 8 k memory cells at addresses specified by row/column decode circuit 3 to a data input/output circuit 5. Data input/output circuit 5 includes a write driver+read amplifier band 6 and an input/output buffer group 7. A write driver group and a read amplifier group are provided in write driver+read amplifier band 6.

The read amplifier group operates in synchronism with a read clock signal CLKR to give read data signals Q1 to Q8k from 8 k memory cells to input/output group 7. Input/output buffer group 7 outputs read data signals Q1 to Q8k from the read amplifier group in response to an external control signal /OE to the outside. The write driver group operates in synchronism with write clock signal CLKW to write write data signals D1 to D8k from the outside onto selected 8 k memory cells. However, no data is written onto memory cells specified by write mask signals WM1 to WMk among the 8 k memory cells.

Figure 2:
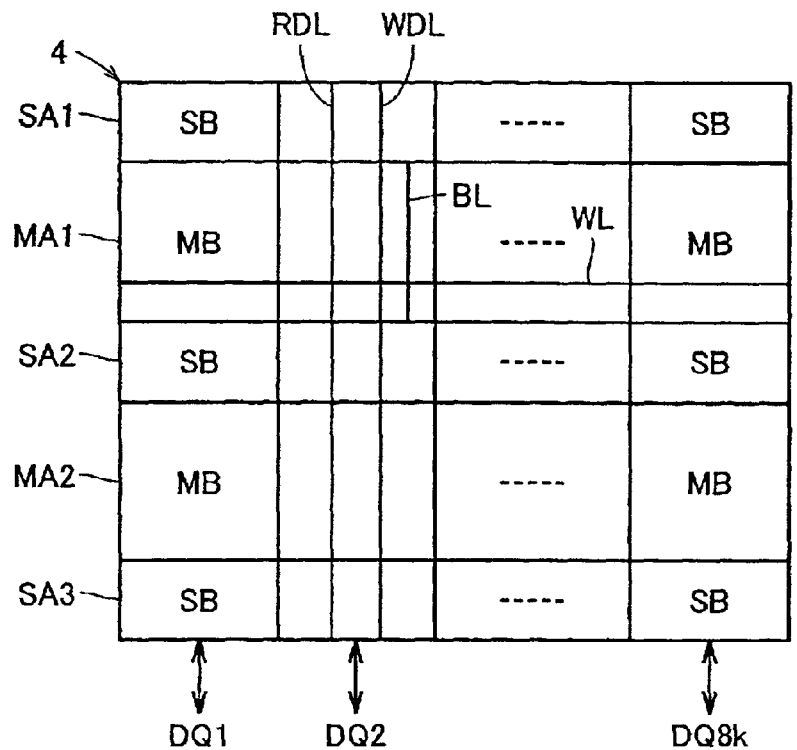
FIG. 2 is a block diagram showing a configuration of a memory mat shown in FIG. 1.

FIG. 2 is a block diagram showing a configuration of memory mat 4 shown in FIG. 1. In FIG. 2, each of memory cell arrays MA1 and MA2 are divided into 8 k memory blocks MB corresponding to data signals DQ1 to DQ8k. Each of sense amplifier bands SA1 to SA3 is divided into 8 k sense blocks SB corresponding to data signals DQ1 to DQ8k.

In memory mat 4, 8 k read data line pairs RDL and /RDL for reading respective data signals Q1 to Q8k and 8 k write data line pairs WDL and /WDL for writing data signals D1 to D8k are provided. Read data line pair RDL and /RDL and write data line pair WDL and /WDL are disposed so as to traverse corresponding 3 sense amplifier blocks SB and two memory blocks MB and one ends of the pairs are connected to write driver+read amplifier band 6.

Figure 3:
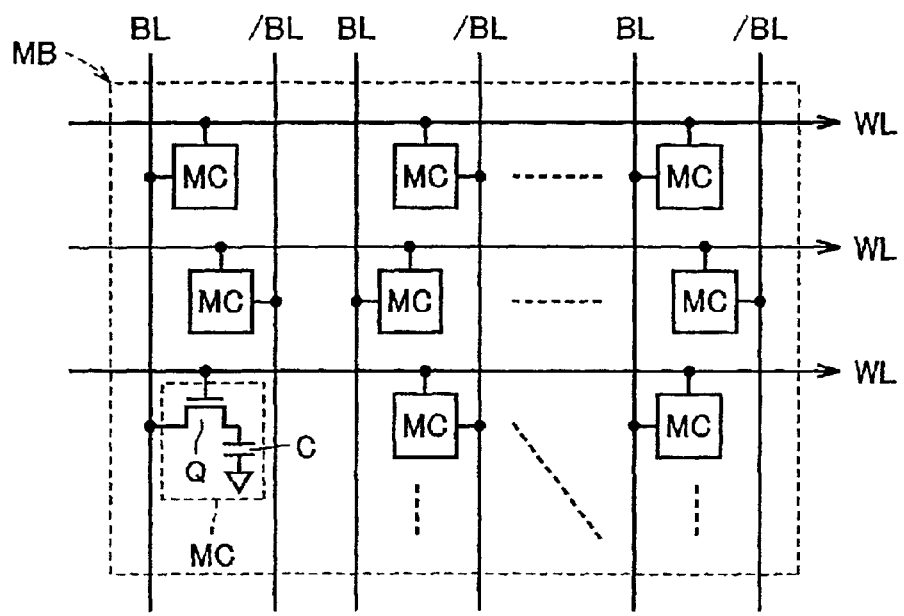
FIG. 3 is a circuit block diagram showing a configuration of a memory block shown in FIG. 2.

Memory block MB, as shown in FIG. 3, includes: plural memory cells MC arranged in plural rows and plural columns; plural word lines WL provided correspondingly to the respective plural rows; and plural bit line pairs BL and /BL provided corresponding to the respective plural columns. Memory cell MC is a well known one including an N channel MOS transistor Q for access and a capacitor C for storing information.

When word line WL is driven to H level, which is a select level, memory cells MC on a row corresponding to word line WL are activated to enable writing/reading of data on the memory cells. In write operation, after one word line WL is driven to H level, which is a select level, to activate memory cells, one bit line of one bit line pair BL and /BL is driven to H level and the other line is driven to L level according to a corresponding write data signal (for example D1). By doing so, a potential of a bit line is written onto desired memory cell MC. In read operation, after potentials on bit line pair BL and /BL are equalized to bit line precharge potential VBL (=VCC/2), one word line WL is driven to H level, which is a select level, to activate memory cells MC. By doing so, a small potential difference corresponding to stored data on memory cell MC occurs between bit lines BL and /BL of each pair. After the small potential difference between the bit lines of each pair is amplified to power supply voltage VCC, a potential difference between bit lines of corresponding one pair is detected, thereby enabling reading a data signal on desired memory cell MC.

Figure 4:
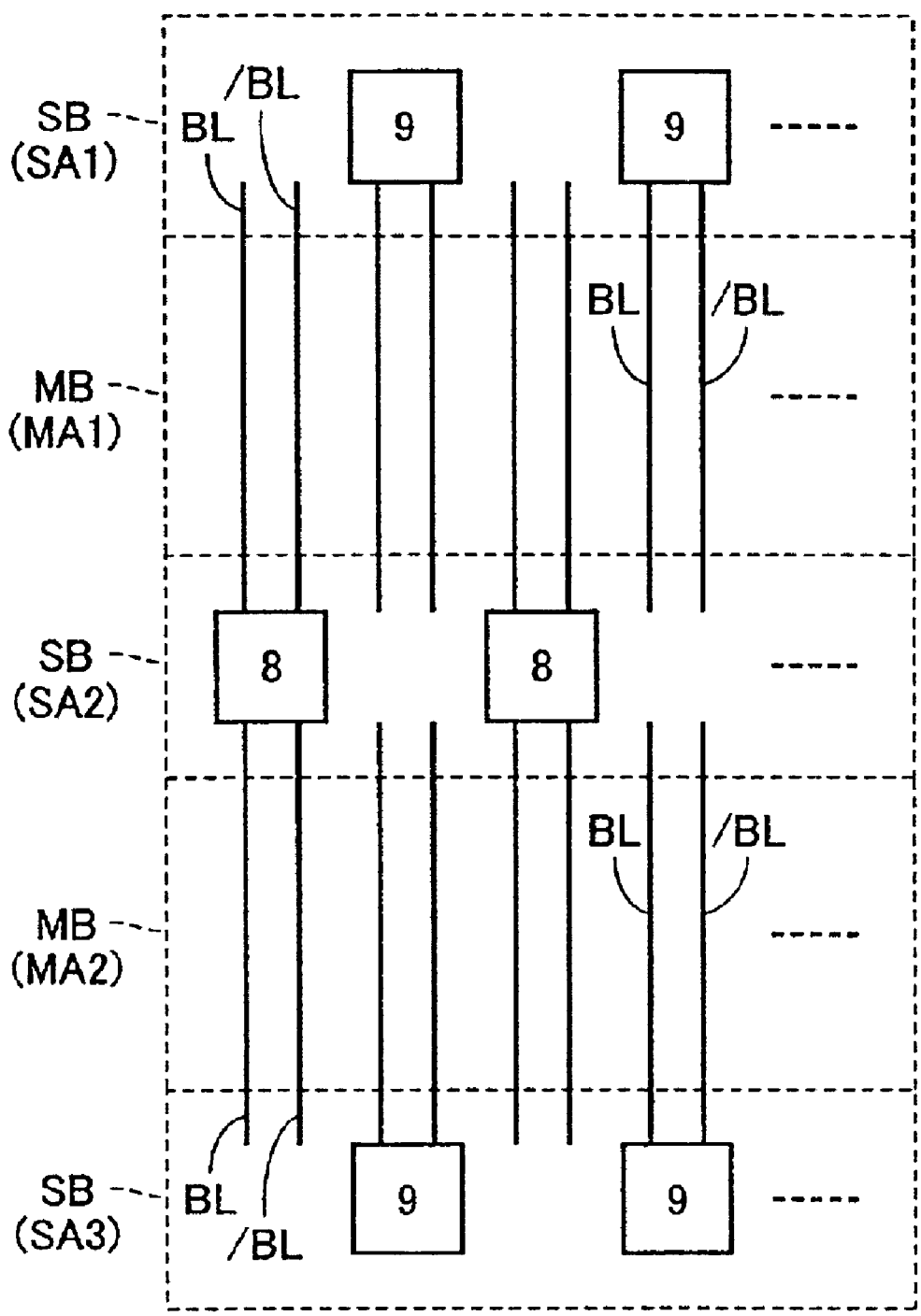
FIG. 4 is a block diagram showing a configuration of a sense block shown in FIG. 2.

Sense block SB of sense amplifier band SA2, as shown in FIG. 4, includes sense amplifier+input/output control circuits 8 each provided commonly to bit line pairs BL and /BL having an odd number in above two memory blocks MB and MB. Sense block SB of each of sense amplifier bands SA1 and SA3 includes sense amplifier+input/output control circuits 9 each provided commonly to bit line pairs having an even number in adjacent memory blocks MB.

Figure 5:
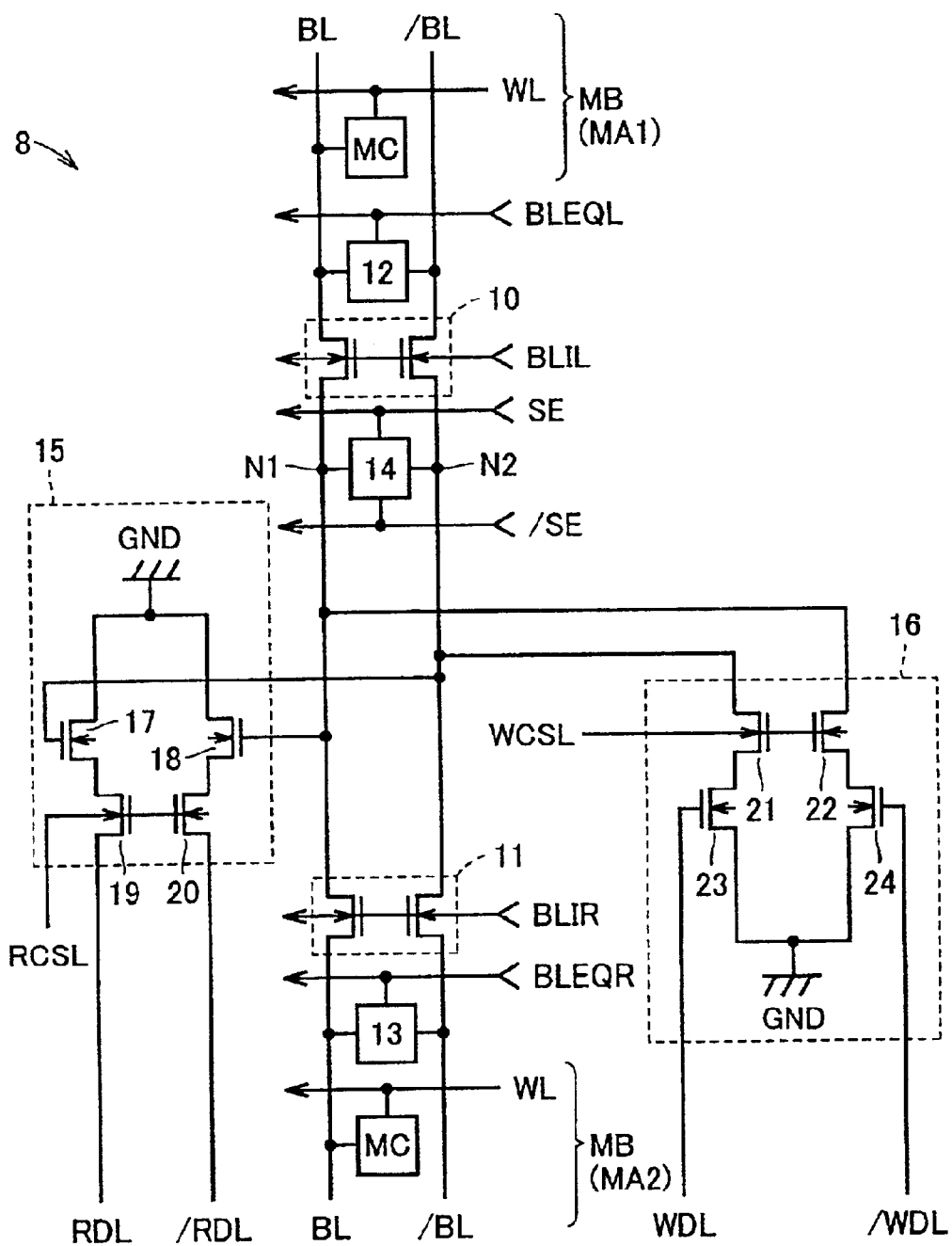
FIG. 5 is a circuit block diagram showing a configuration of a sense amplifier+an input/output control circuit 8 combined shown in FIG. 4.

Sense amplifier+input/output control circuit 8, as shown in FIG. 5, includes: transfer gates 10 and 11; bit line equalize circuits 12 and 13; a sense amplifier 14; a read gate 15 and a write gate 16. Transfer gate 10 is connected between corresponding bit line pair BL and /BL of memory block MB of memory cell array MA1 and a pair of respective nodes N1 and N2 and includes one pair of N channel MOS transistors, receiving signal BLIL at both of the gates thereof. Transfer gate 11 is connected between corresponding bit line pair BL and /BL of memory block MB of memory cell array MA2 and the pair of respective nodes N1 and N2 and includes one pair of N channel MOS transistors, receiving signal BLIR at both of the gates thereof.

When signal of BLIL between signals BLIL and BLIR is driven to L level by row/column decode circuit 3, two N channel MOS transistors of transfer gate 10 are caused to be non-conductive to disconnect bit line pair BL and /BL of memory cell array MA1 and pair of node N1 and N2 from each other. When signal of BLIR between signals BLIL and BLIR is driven to L level by row/column decode circuit 3, two N channel MOS transistors of transfer gate 11 are caused to be non-conductive to disconnect bit line pair BL and /BL of memory cell array MA2 and pair of node N1 and N2 from each other.

Bit line equalize circuit 12 is connected to bit line pair BL and /BL of memory cell array MA1 and bit line equalize signal BLEQL is driven to L level, which is an active level, in response to which corresponding bit line pair BL and /BL are equalized to bit line precharge potential VBL.

Figure 6:
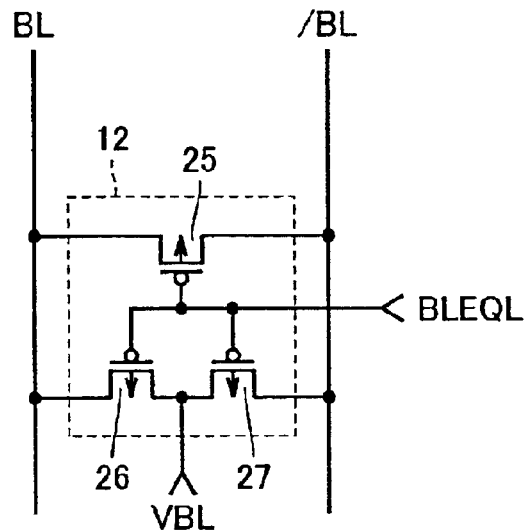
FIG. 6 is a circuit block diagram showing a configuration of a bit line equalize circuit shown in FIG. 5.

That is, bit line equalize circuit 12, as shown in FIG. 6, includes P channel MOS transistors 25 to 27. P channel MOS transistor 25 is connected between bit lines BL and /BL, P channel MOS transistors 26 and 27 are connected in series between bit lines BL and /BL. Bit line equalize signal BLEQL is given to the gates of P channel MOS transistors 25 to 27. Bit line precharge potential VBL is given to a node between P channel MOS transistors 26 and 27.

When bit line equalize signal BLEQL is driven to L level, which is an active level, by row/column decode circuit 3, P channel MOS transistors 25 to 27 are caused to be conductive to drive bit lines BL and /BL both to bit line precharge potential VBL. When bit line equalize signal BLEQL is driven to H level, which is an inactive level, by row/column decode circuit 3, P channel MOS transistors 25 to 27 are caused to be non-conductive to cease equalization of bit lines BL and /BL.

Bit line equalize circuit 13 is connected to bit lines BL and /BL of memory cell array MA2 and bit line equalize signal BLEQR is driven to L level, which is an active level, in response to which corresponding bit line pair BL and /BL are equalized to bit line precharge potential VBL. Bit line equalize circuit 13 is of a configuration similar to that of bit line equalize circuit 12.

Figure 7:
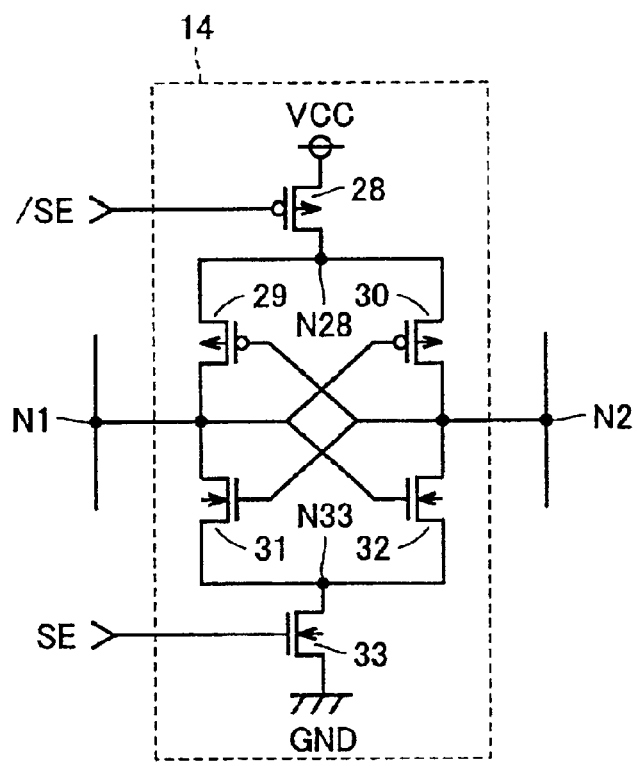
FIG. 7 is a circuit diagram showing a configuration of the sense amplifier shown in FIG. 5.

Sense amplifier 14 is activated in response to transition of sense amplifier activation signals SE and /SE to H level and L level, respectively, to amplify a small potential differential occurring between nodes N1 ad N2 to power supply voltage VCC. That is, sense amplifier 14, as shown in FIG. 7, includes: P channel MOS transistors 28 to 30 and N channel MOS transistors 31 to 33. P channel MOS transistor 28 is connected between power supply voltage VCC line and a node N28 and receives signal /SE at the gate thereof. P channel MOS transistors 29 and 30 are connected between node 28 and each of respective nodes N1 and N2 and the gates thereof are connected to the respective nodes N2 and N1. N channel MOS transistors 31 and 32 are connected between each of respective nodes N1 and N2 and node 28 and the gates thereof are connected to the respective nodes N2 and N1. N channel MOS transistor 33 is connected between node 33 and ground potential GND line and receives signal SE at the gate thereof.

In a case where sense amplifier activation signals SE and /SE are driven to L level and H level, respectively, by row/column decode circuit 3, P channel MOS transistor 28 and N channel MOS transistor 33 are caused to be non-conductive to deactivate sense amplifier 14. When sense amplifier activation signals SE and /SE are driven to H level and L level, respectively, by row/column decode circuit 3, P channel MOS transistor 28 and N channel MOS transistor 33 are caused to be conductive to activate sense amplifier 14.

In a case where a potential of node N1 is higher than a potential of node N2, resistance values of MOS transistors 29 and 32 become lower than those of MOS transistors 30 and 31, thereby raising the potential of node N1 to power supply potential VCC and in addition, lowering the potential of node N2 to ground potential GND. In a case where a potential of node N2 is higher than a potential of node N1, resistance values of MOS transistors 30 and 31 become lower than those of MOS transistors 29 and 32, thereby raising the potential of node N2 to power supply potential VCC and in addition, lowering the potential of N1 to ground potential GND.

Returning to FIG. 5, read gate 15 includes N channel MOS transistors 17 to 19. N channel MOS transistors 17 and 19 are connected in series between ground potential GND line and corresponding read data line RDL; N channel MOS transistors 18 and 20 are connected in series between ground potential GND line and corresponding read data line /RDL. The gates of N channel MOS transistors 17 and 18 are connected to respective nodes N2 and N1; and the gates of N channel MOS transistors 19 and 20 are connected both to read column select line RCSL of a corresponding column. Read column select line RCSL is provided commonly to 8 k sense blocks SB of sense amplifier band SA2 in correspondence to each sense amplifier+input/output control circuit 8.

In read operation, read data lines RDL and /RDL are first precharged to H level (power supply potential VCC). When read column select line RCSL is driven to H level, which is a select level, by row/column decode circuit 3, N channel MOS transistors 19 and 20 are caused to be conductive. In a case where nodes N1 and N2 are at H level and L level, respectively, N channel MOS transistor 18 is caused to be conductive and in addition, N channel MOS transistor 17 is caused to be non-conductive and to drive read data lines RDL and /RDL to H level and L level, respectively. In a case where nodes N1 and N2 are at L level and H level, respectively, N channel MOS transistor 17 is caused to be conductive and in addition, N channel MOS transistor 18 is caused to be non-conductive and to drive read data lines RDL and /RDL to L level and H level, respectively.

Write gate 16 includes N channel MOS transistors 21 to 24. N channel MOS transistors 21 and 23 are connected in series between node N2 and ground potential GND line, and N channel MOS transistors 22 and 24 are connected in series between node N1 and ground potential GND line. The gates of N channel MOS transistors 21 and 22 are connected both to write column select line WCSL of a corresponding column. The gates of N channel MOS transistors 23 and 24 are connected to respective write data lines WDL and /WDL. Write column select line WCSL is provided commonly to 8 k sense blocks of sense amplifier band SA2 in correspondence to each sense amplifier+input/output control circuit 8.

When write column select line WCSL is driven to H level, which is a select level, by row/column decode circuit 3, N channel MOS transistors 21 and 22 become conductive. In a case where write data line WDL and /WDL are at H level and L level, respectively, N channel MOS transistor 23 between N channel MOS transistors 23 and 24 becomes conductive to drive node N2 to L level and sense amplifier 14 drives node N1 to H level. In a case where write data lines WDL and /WDL are at L level and H level, respectively, N channel MOS transistor 24 between N channel MOS transistors 23 and 24 becomes conductive to drive node N1 to L level and sense amplifier 14 drives node N2 to H level.

Sense amplifier+input/output control circuit 9 of sense amplifier band SA1 has a configuration obtained by removing transfer gates 10 and 11, and bit line equalize circuit 13 for memory cell array MA2 from sense amplifier+input/output control circuit 8 of sense amplifier band SA2. Sense amplifier+input/output control circuit 9 of sense amplifier band SA3 has a configuration obtained by removing transfer gates 10 and 11, and bit line equalize circuit 12 for memory cell array MA1 from sense amplifier+input/output control circuit 8 of sense amplifier band SA2. Note that column select lines RCSL and WCSL for sense amplifier band SA1 and column select lines RCSL and WCSL for sense amplifier band SA3 are provided separately from each other.

Figure 8:
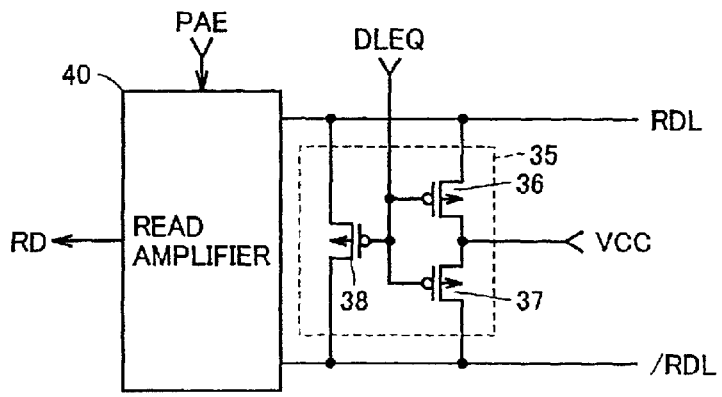
FIG. 8 is a circuit block diagram showing a configuration of a data line equalize circuit and a read amplifier circuit connected to a read data line pair shown in FIG. 5.

Data line equalize circuit 35 and read amplifier 40 are, as shown in FIG. 8, provided to read data line pair RDL and /RDL. Data line equalize circuit 35 equalizes corresponding read data lines RDL and /RDL to H level (power supply potential VCC) in response to transition of data line equalize signal DLEQ to L level, which is an active level.

That is, data line equalize circuit 35 includes P channel MOS transistors 36 to 38. P channel MOS transistors 36 and 37 are connected in series between read data lines RDL and /RDL, and P channel MOS transistor 38 is connected between read data lines RDL and /RDL. A data line equalize signal DLEQ is given to the gates of P channel MOS transistors 36 to 38. Power supply potential VCC is given to a node between P channel MOS transistors 36 and 37.

When signal DLEQ is driven to L level, which is an active level, P channel MOS transistors 36 to 38 become conductive to drive read data lines RDL and /RDL both to power supply potential VCC. When signal DLEQ is driven to H level, which is an inactive level, P channel MOS transistors 36 to 38 become non-conductive to cease equalization of read data lines RDL and /RDL.

Read amplifier 40 is activated in response to transition of preamplifier activation signal PAE to H level, which is an active level, to compare potentials of read data lines RDL and /RDL in magnitude and to output internal data signal RD corresponding to a result of the comparison.

Figure 9:
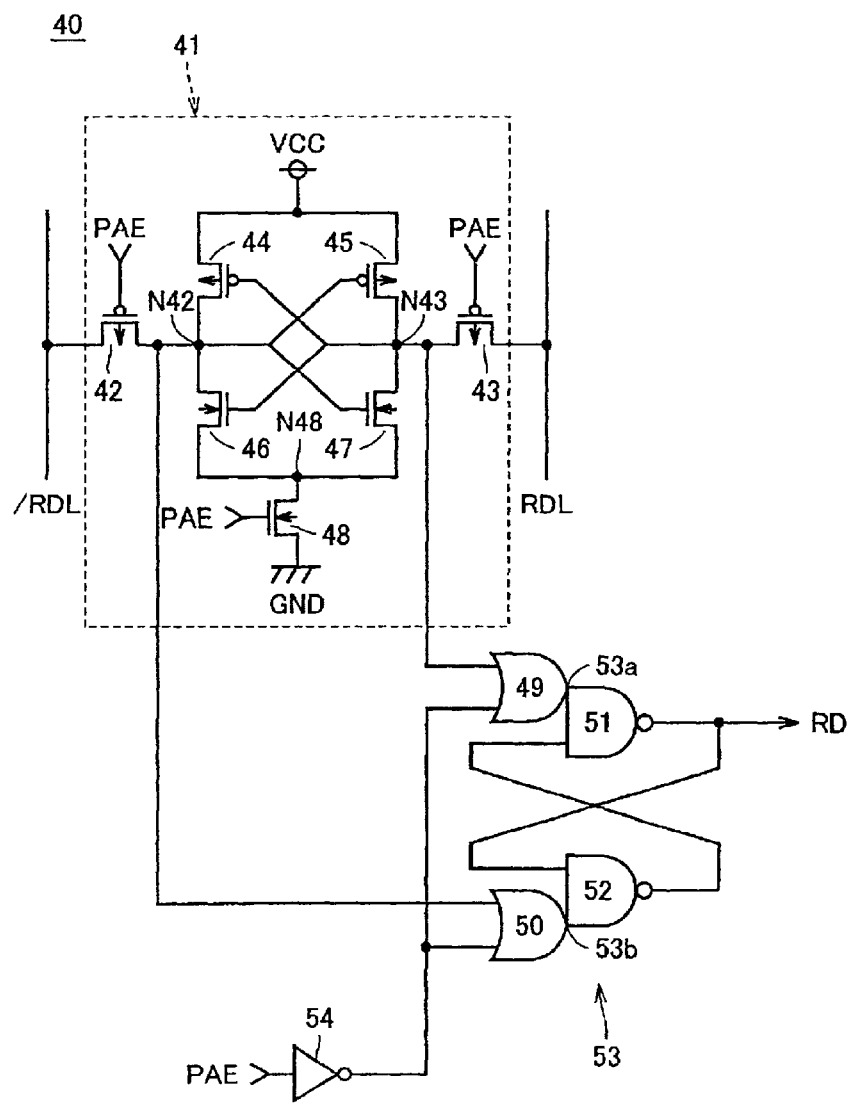
FIG. 9 is a circuit diagram showing a configuration of the read amplifier shown in FIG. 8.

That is, read amplifier 40, as shown in FIG. 9, includes: a preamplifier 41, OR gates 49 and 50; NAND gates 51 and 52; and an inverter 54, wherein NAND gates 51 and 52 constitute a flip-flop 53. Preamplifier 41 includes: P channel MOS transistors 42 to 45; and N channel MOS transistors 46 to 48. P channel MOS transistor 42 is connected between read data line /RDL and a node 42 and the gate thereof receives preamplifier activation signal PAE. P channel MOS transistor 43 is connected between read data line RDL and a node N43 and the gate thereof receives preamplifier activation signal PAE.

P channel MOS transistors 44 and 45 are connected between power supply potential VCC line and each of respective nodes N42 and N43 and the gates thereof are connected to respective nodes N43 and N42. N channel MOS transistors 46 and 47 are connected between each of respective nodes N42 and N43 and node N48 and the gates thereof are connected to respective nodes N43 and N42. N channel MOS transistor 48 is connected between node N48 and ground potential GND line and the gate thereof receives preamplifier activation signal PAE.

In read operation, signal PAE is first driven to L level, which is an inactive level. Thereby, P channel MOS transistors 42 and 43 become conductive to apply potentials on read data lines RDL and /RDL to nodes N43 and N42 and in addition, N channel MOS transistor 48 becomes non-conductive to deactivate preamplifier 41.

Then, signal PAE is driven to H level, which is an active level. Thereby, P channel MOS transistors 42 and 43 become non-conductive and in addition, N channel MOS transistor 48 becomes conductive to activate preamplifier 41. When a potential of node N42 is higher than that of node N43, resistance values of MOS transistors 44 and 47 become lower than those of MOS transistors 45 and 46; and node N42 is raised to H level and in addition, node N43 is lowered to L level. When a potential of node N43 is higher than that of node N42, resistance values of MOS transistors 45 and 46 become lower than those of MOS transistors 44 and 47; and node N43 is raised to H level and addition, node N42 is lowered to L level.

Nodes N42 and N43 are connected to one input nodes of respective OR gates 50 and 49. Preamplifier activation signal PAE is inputted to the other input nodes of OR gates 49 and 50 through inverter 54. Output signals of OR gates 49 and 50 are inputted to a set terminal 53a and a reset terminal 53b, respectively, of flip-flop 53. An output signal of flip-flop 53 is output signal RD of read amplifier 42. Flip-flop 53 is reset by a reset signal (not shown) in each read operation.

In read operation, signal PAE is first driven to L level, which is an inactive level. By doing so, output signals of OR gates 49 and 50 are both fixed at H level. Then, signal PAE is driven to H level, which is an active level. Thereby, levels of nodes N42 and N43 are given to reset terminal 53b and set terminal 53a, respectively, of flip-flop 53. In a case where nodes N42 and N43 are at H level and L level, respectively, flip-flop 53 is set to drive internal data signal RD to H level. In a case where nodes N42 and N43 are at L level and H level, respectively, flip-flop 53 is reset to drive internal data signal RD to L level. Internal data signal RD is outputted as read data signal Q to the outside by an input/output buffer.

Figure 10:
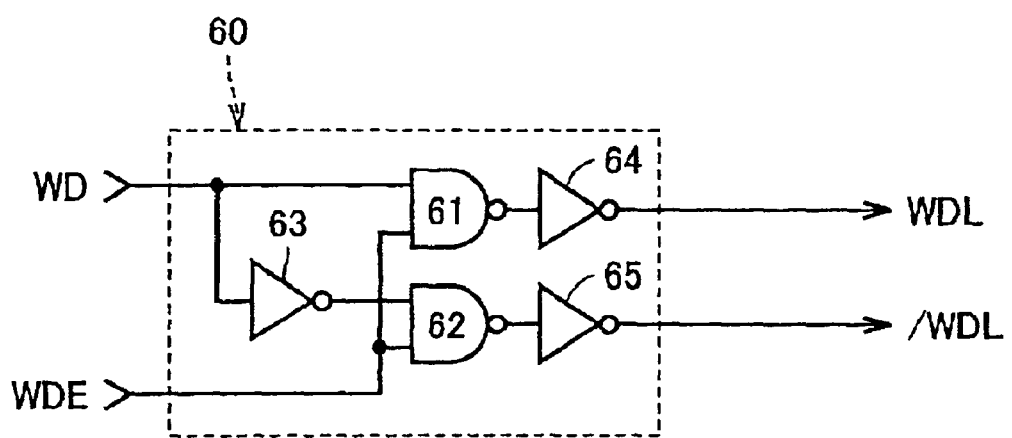
FIG. 10 is a circuit block diagram showing a configuration of a write driver connected to a write data line pair shown in FIG. 5.

A write driver 60 is, as shown in FIG. 10, provided to each write data line pair WDL and /WDL. Write driver 60 includes: NAND gates 61 and 62; and inverters 63 to 65. Write data signal WD produced on the basis on external data signal by the input/output buffer is inputted to one input node of NAND gate 61 and in addition, to one input node of NAND gate 62 through inverter 63. Write driver activation signal WDE is inputted to the other gates of NAND gates 61 and 62. An output signal of NAND gate 61 is inverted by inverter 64 to give the inverted signal onto write data line WDL. An output signal of NAND gate 62 is inverted by inverter 65 to give the inverted signal onto write data line /WDL.

In write operation and when corresponding write mask signal WM is at L level, which is an inactive level, signal WDE is driven to H level, which is an active level, to operate NAND gates 61 and 62 as inverters. In a case where signal WD is at H level, write data lines WDL and /WDL are driven to H level and L level, respectively, and in a case where signal WD is at L level, write data lines WDL and /WDL are driven to L level and H level, respectively.

In operations other than write operation or when corresponding write mask WM is at H level, which is an active level, even in write operation, signal WDE is driven to L level, which is an inactive level. Thereby, output nodes of NAND gates 61 and 62 are fixed both at H level, and write data lines WDL and /WDL are fixed both at L level. When write data lines WDL and /WDL are driven both to L level, N channel MOS transistors 23 and 24 of FIG. 5 become both non-conductive and even if write column select line WCSL is driven to H level, which is a select level, no rewriting of a data signal is performed.

Figure 11:
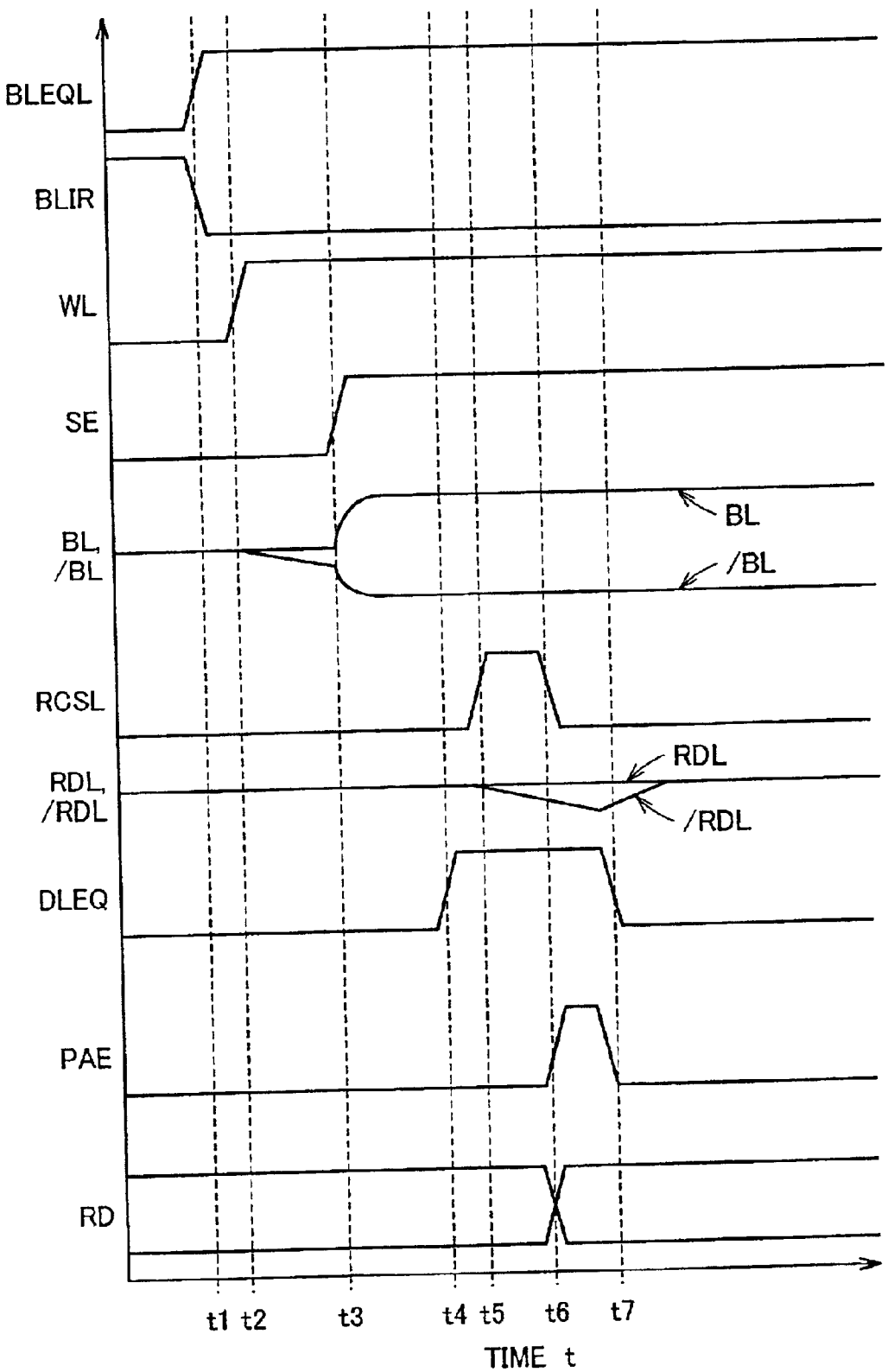
FIG. 11 is a time chart showing a read operation of DRAM shown in FIGS. 1 to 10.

FIG. 11 is a time chart showing read operation of DRAM 1 shown in FIGS. 1 to 10. Note that memory cell array MA1 and sense amplifier band SA2 are selected and description will be given of only reading of one data signal.

First of all, at a time point t1, bit line equalize signal BLEQL is raised to H level from L level and in addition, array select signal BLIR is lowered to L level from H level. Thereby, bit line equalize circuit 12 is deactivated, and in addition, one pair of N channel MOS transistors of transfer gate 11 becomes non-conductive.

Then, at a time point t2, word line WL of a row corresponding to row address signal RA0 to RAm is raised to H level, which is a select level, and memory cells MC on the row are activated to produce small potential differences between bit lines BL and /BL. Then, at a time point t3, sense amplifier activation signal SE is raised to H level from L level and in addition, signal /SE is lowered to L level from H level to activate sense amplifier 14; and a bit line (for example BL) is driven to H level and in addition, a bit line (/BL in this case) is driven to L level. For example, when bit lines BL and /BL are driven to H level and L level, respectively, N channel MOS transistor 17 of FIG. 5 becomes non-conductive and in addition, N channel MOS transistor 18 becomes conductive.

Then, at a time point t4, data line equalize signal DLEQ is raised to H level from L level to deactivate data line equalize circuit 35 of FIG. 8 and to cease equalization of read data line pair RDL and /RDL. Subsequent to this, at a time point t5, read column select line RCSL of a column corresponding to column address signal CA0 to CAm is raised to H level, which is a select level, and N channel MOS transistors 19 and 20 become conductive to cause a current to flow out from read data line /RDL to ground potential GND line through N channel MOS transistors 20 and 18, thereby lowering a potential of read data line /RDL gradually.

Then, at a time point t6, read column select line RCSL is lowered to L level, which is a non-select level and N channel MOS transistors 19 and 20 are caused to be non-conductive, thereby disconnecting read data line pair RDL and /RDL and ground potential GND from each other. Furthermore, preamplifier activation signal PAE is driven to H level and stays there for a prescribed time as short as a pulse and read amplifier 40 is activated to make firm a level of read data signal RD. Subsequent to this, at a time point t7, data line equalize signal DLEQ is lowered to L level, which is an active level, to precharge read data line RDL and /RDL to power supply potential VCC, thus ending one time of read operation.

Figure 12:
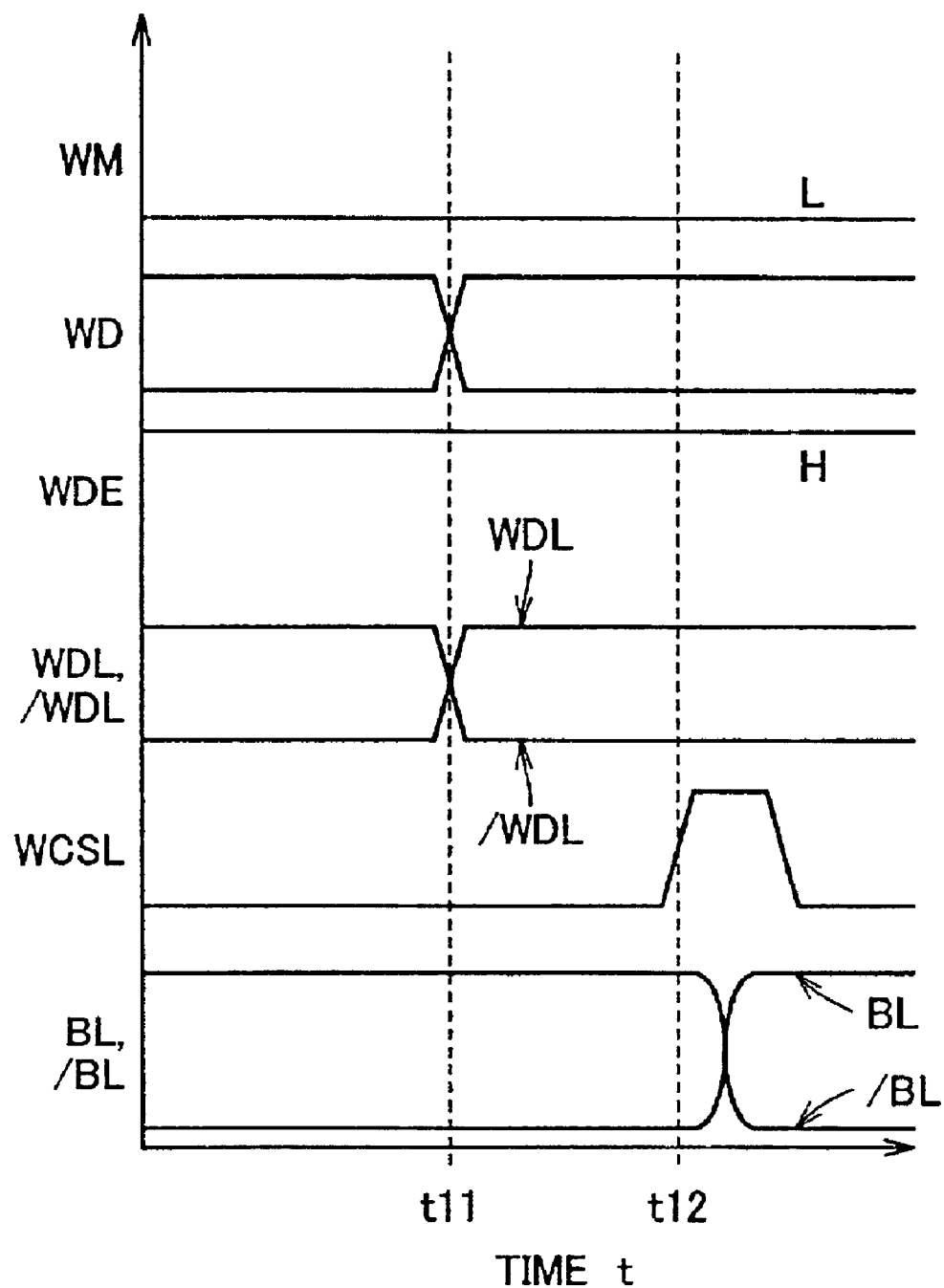
FIG. 12 is a time chart showing a write operation of DRAM shown in FIGS. 1 to 10.

FIG. 12 is a time chart showing write operation of DRAM 1 shown in FIGS. 1 to 10. Note that memory cell array MA1 and sense amplifier band SA2 are selected and description will be given of only writing of one data signal. Furthermore, write mask signal WM is fixed at L level.

Bit line equalize circuit 12 of FIG. 5 is first deactivated, similar to the read operation at time points from t1 to t3 shown in FIG. 11, one pair of N channel MOS transistors of transfer gate 11 is caused to be non-conductive, word line WL is driven to H level, which is a select level, and sense amplifier 14 is activated to amplify a potential difference between bit line pair BL and /BL to power supply potential VCC.

Then, at a time point t11, a level of write data signal WD is made firm and in addition, levels on write data line WDL and /WDL are made firm. For example, assume that write data line WDL and /WDL are driven to H level and L level, respectively. Thereby, N channel MOS transistor 23 of FIG. 5 become conductive and in addition, N channel MOS transistor 24 becomes non-conductive.

Then, at a time point t12, write column select line WCSL of a column corresponding to column address signal CA0 to CAm is driven to H level, which is a select level, and stays there for a prescribed time to cause N channel MOS transistors 21 and 22 of FIG. 5 to be conductive. Thereby, bit line /BL is grounded through N channel MOS transistors 21 and 23 and sense amplifier 14 drives bit lines BL and /BL to H level and L level, respectively. Thereafter, word line WL is driven to L level, which is a non-select level, sense amplifier 14 is deactivated and bit line equalize circuit 12 is deactivated, thereby ending write operation.

Figure 13:
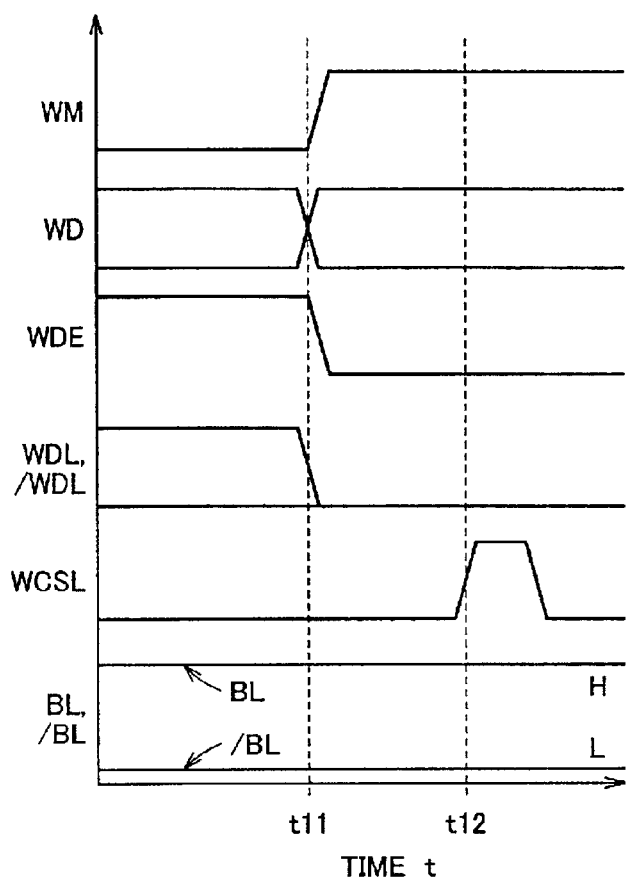
FIG. 13 is another time chart showing a write operation of DRAM shown in FIGS. 1 to 10.

FIG. 13 is another time chart showing write operation of DRAM 1 shown in FIGS. 1 to 10. Note that memory cell array MA1 and sense amplifier band SA2 are selected and description will be given of only writing of one data signal. An initial state is the same as that of write operation described in FIG. 12.

At a time point t11, write mask signal WM is raised to H level, which is an active level and write driver activation signal WDE is lowered to L level, which is an inactive level. Furthermore, although a level of write data signal WD is made firm, write driver activation signal WD is at L level; therefore, write driver 60 of FIG. 10 is deactivated to fix write data lines WL and /WL both at L level and N channel MOS transistors 23 and 24 become both non-conductive.

Then at a time point t12, although write column select line WCSL is raised to H level and stay there for a prescribed time as short as a pulse to cause N channel MOS transistors 21 and 22 of FIG. 5 to be conductive, since N channel MOS transistors 23 and 24 are non-conductive, levels of bit lines BL and /BL do not change and no rewriting is performed. Thereafter, word line WL is driven to L level, which is a non-select level, sense amplifier 14 is deactivated and bit line equalize circuit 12 is activated, thereby ending writing operation.

In this first embodiment, since read gate 15 and write gate 16 are both of a gate receiving type, read data line pair RDL and /RDL and bit line pair BL and /BL are not directly connected to each other, and write data line pair WDL and /WDL and bit line pair BL and /BL are not directly connected to each other either. Therefore, a data signal on bit line pair BL and /BL has no chance to be destroyed by noise occurring on data line pairs RDL and /RDL, and WDL and /WDL.

Furthermore, since no precharging of write data lines WDL and /WDL are performed in write operation, a higher speed write operation can be ensured as compared with a prior practice in which global 10 line pair GIO and /GIO are precharged to power supply potential VCC in each write operation.

Moreover, in a case where write mask signal WM is driven to H level to inhibit rewriting of data, write data lines WDL and /WDL are both driven to L level to cause N channel MOS transistors 23 and 24 of write gate 16 to be non-conductive; therefore, no current flows out from write data line pair WDL and WDL and bit line pair BL and /BL. Therefore, reduction in consumed current can be achieved. Furthermore, with the effects, stabilization of operation of sense amplifier 14 can be realized.

Figure 14:
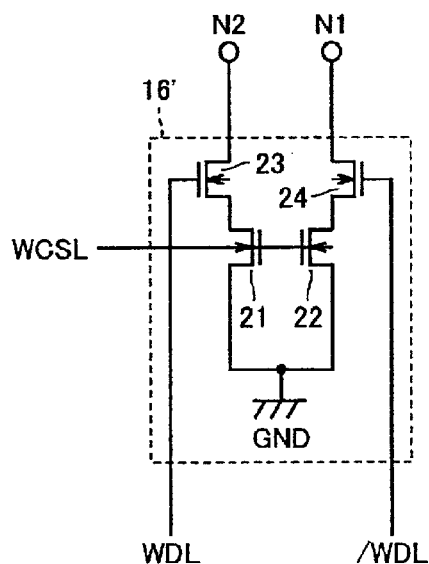
FIG. 14 is a circuit diagram showing an example modification of a first embodiment.

Note that although in write gate 16 of FIG. 5, N channel MOS transistors 22 and 24 are connected in series between node N1 and ground potential GND line and in addition, N channel MOS transistors 21 and 23 are connected in series between node N2 and ground potential GND line, needless to say that the same effect can be obtained even if N channel MOS transistors 24 and 22 are connected in series between node N1 and ground potential GND line and in addition, N channel MOS transistors 23 and 21 are connected in series between node N2 and ground potential GND line as shown in FIG. 14.

Second Embodiment

Figure 15:
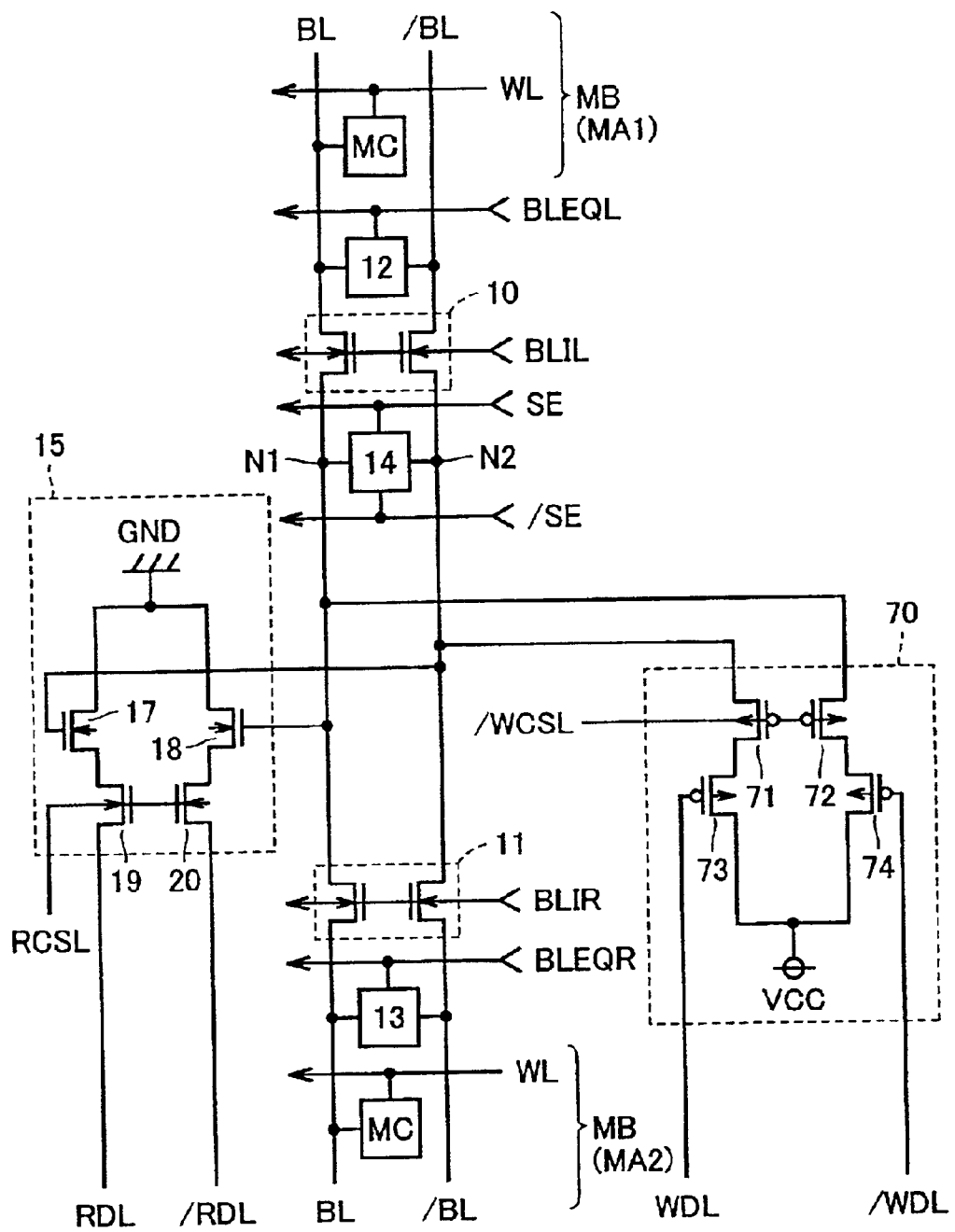
FIG. 15 is a circuit block diagram showing a main section of DRAM according to a second embodiment of the present invention.

FIG. 15 is a circuit block diagram showing a main section of DRAM according to a second embodiment of the present invention, and the diagram is a figure to compare with FIG. 5. Referring to FIG. 15, what aspect DRAM of the second embodiment is different from DRAM 1 of the first embodiment in is that write gate 16 is replaced with write gate 70 and in addition, write column select line WCSL is replaced with write column select line /WCSL. Write column select line /WCSL of a column corresponding to column address signal CA0 to CAm is lowered to L level, which is a select level, by row/column decode circuit 3.

Write gate 70 includes P channel MOS transistors 71 to 74. P channel MOS transistors 71 and 73 are connected in series between node N2 and power supply potential VCC line and P channel MOS transistors 72 and 74 are connected in series between node N1 and power supply potential VCC line. The gates of P channel MOS transistors 71 and 72 are both connected to write column select line /WCSL and the gates of P channel MOS transistors 73 and 74 are connected to respective write column select lines WDL and /WDL.

When write column select line /WCSL is driven to L level, which is a select level, by row/column decode circuit 3, P channel MOS transistors 71 and 72 become conductive. In a case where write data lines WDL and /WDL are at H level and L level, respectively, P channel MOS transistor 74 between P channel MOS transistors 73 and 74 becomes conductive to drive node N1 to H level and sense amplifier 14 drives node N2 to L level. In a case where write data line WDL and /WDL are at L level and H level, respectively, P channel MOS transistor 73 between P channel MOS transistors 73 and 74 becomes conductive to drive node N2 to H level and sense amplifier 14 drives node N1 to L level.

Figure 16:
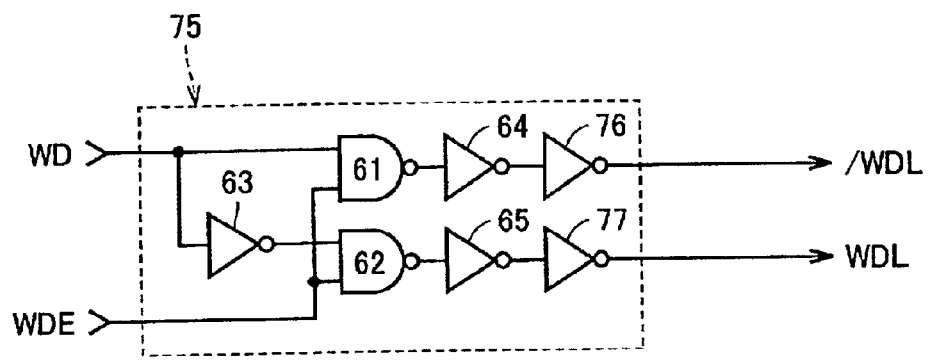
FIG. 16 is a circuit diagram showing a configuration of a write driver connected to a write data line pair shown in FIG. 15.

Furthermore, in this DRAM, write driver 60 is replaced with write driver 75. Write driver 75 has a configuration obtained by adding inverters 76 and 77 to write driver 60 as shown in FIG. 16. Inverter 76 inverts an output signal of inverter 64 to give the inverted signal onto write data line /WDL. Inverter 77 inverts an output signal to give the inverted signal of inverter 65 onto write data line WDL.

In write operation and when write mask signal WM is at L level, which is an inactive level, signal WDE is driven to H level, which is an active level, and NAND gates 61 and 62 operates as inverters. In a case where signal WD is at H level, write data lines WDL and /WDL are driven to H level and L level, respectively, and in a case where signal WD is at L level, write data lines WDL and /WDL are driven to L level and H level, respectively.

In operations other than write operation or when write mask signal WM is at H level, which is an active level, even in write operation, signal WDE is driven to L level, which is an inactive level, output nodes of NAND gates 61 and 62 are both fixed at H level and write data lines WDL and /WDL are both fixed at H level. When write data lines WDL and /WDL are both driven to H level, P channel MOS transistors 73 and 74 of FIG. 15 become both non-conductive and even if write column select line /WCSL is driven to L level, which is a select level, no rewriting of a data signal is performed.

Figure 17:
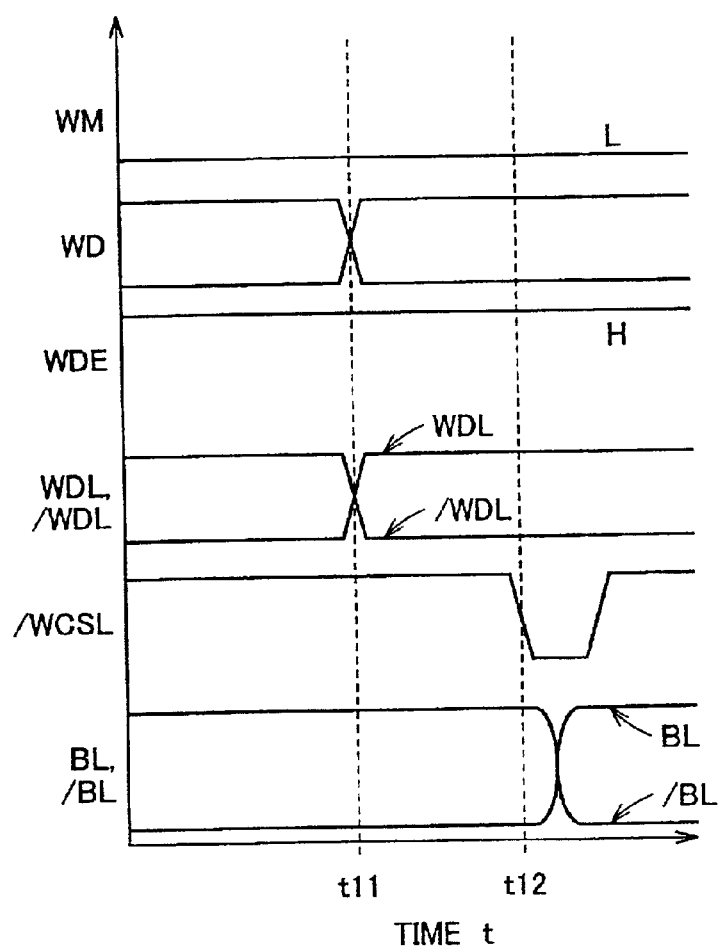
FIG. 17 is a time chart showing a write operation of DRAM shown in FIGS. 15 and 16.

FIG. 17 is a time chart showing write operation of DRAM shown in FIGS. 15 and 16. Note that write mask signal is fixed at L level.

At a time point t11, first, a level of write data line WD is made firm and levels of write data lines WDL and /WDL are made firm. For example, assume that write data lines WDL and /WDL are driven to H level and L level, respectively. Thereby, P channel MOS transistor 74 of FIG. 15 becomes conductive and in addition, P channel MOS transistor 73 becomes non-conductive.

Then, at a time point t12, write column select line /WCSL of a column corresponding to column address signal CA0 to CAm is driven to L level, which is a select level, and stays there for a prescribed time as short as a pulse to cause P channel MOS transistors 71 and 72 of FIG. 15 to be conductive. Thereby, bit line BL is connected to power supply potential VCC line through P channel MOS transistors 72 and 74 and sense amplifier 14 drives bit lines BL and /BL to H level and L level, respectively. A potential on bit line BL or /BL are given to selected memory cell.

Figure 18:
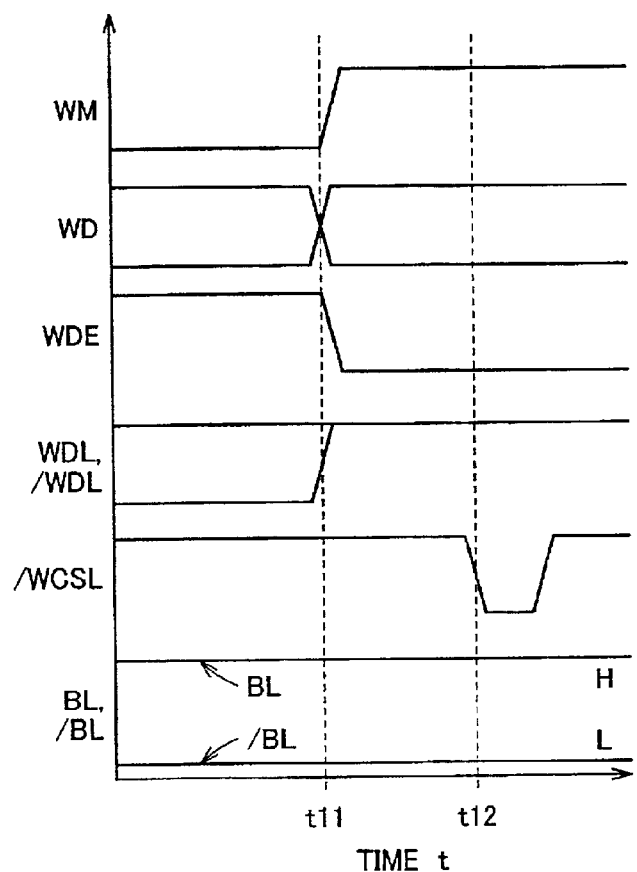
FIG. 18 is another time chart showing a write operation of DRAM shown in FIGS. 15 and 16.

FIG. 18 is another time chart showing write operation of DRAM shown in FIGS. 15 and 16. At time point t11, write mask signal WM is raised to H level, which is an active level and write driver activation signal WDE is lowered to L level, which is an inactive level. Moreover, although a level of write data signal WD is made firm, write driver activation signal WDE is at L level; therefore, write driver 75 of FIG. 16 is deactivated to fix write data line WDL and /EDL both at H level. Thereby, P channel MOS transistors 73 and 74 of FIG. 15 become non-conductive.

Then, at time point t12, although write column select line /WCSL is lowered to L level and stays there for a prescribed time as short as a pulse to cause p channel MOS transistors 71 and 72 of FIG. 15 to be conductive, since P channel MOS transistors 73 and 74 are non-conductive, levels of bit lines BL and /BL do not change and no rewriting is performed. Since the other parts of the configuration and the remainder of operation are the same as those of the first embodiment, no description thereof is repeated.

When a P channel MOS transistor and an N channel MOS transistor both with the same size are compared with each other, the P channel MOS transistor is smaller in current drive ability than the N channel MOS transistor. However, in the first embodiment, since one of bit lines BL and /BL is driven to L level with write gate 16 and the other is driven to H level by P channel MOS transistors 28 to 30 of sense amplifier 14, there is a necessity that P channel MOS transistors 28 to 30 of sense amplifier 14 are large in size, thus enlarging a layout area of sense amplifier 14. In this second embodiment, however, one of bit lines BL and /BL is driven to H level with write gate 70 and the other is driven to L level by N channel MOS transistors 31 and 33 of sense amplifier 14; therefore, there is no necessity that P channel MOS transistors 28 to 30 of sense amplifier 14 are large in size. Accordingly, a layout area of sense amplifier 14 remains smaller compared with the first embodiment.

Figure 19:
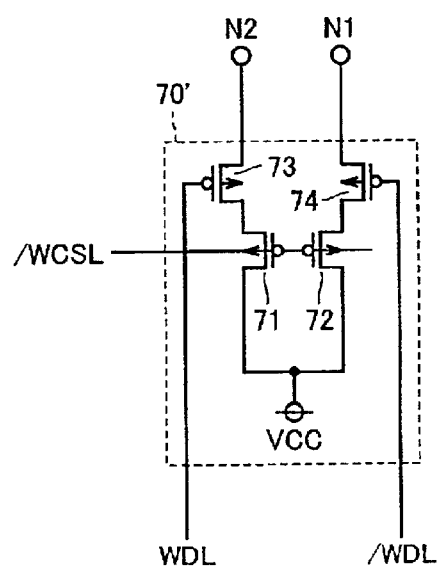
FIG. 19 is a circuit diagram showing an example modification of the second embodiment.
Figure 20:
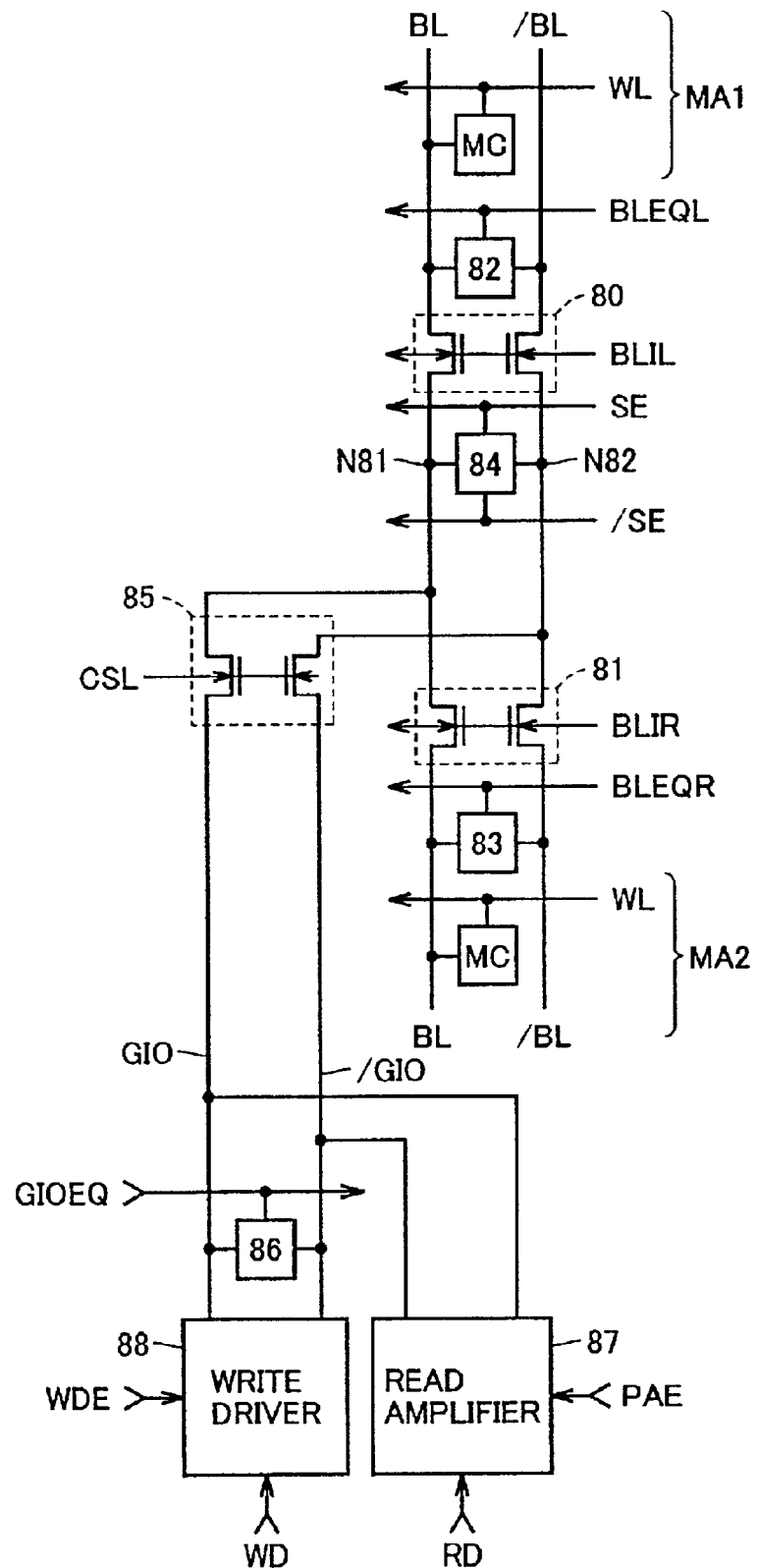
FIG. 20 is a circuit block diagram showing a main section of a prior art DRAM.
Figure 21:
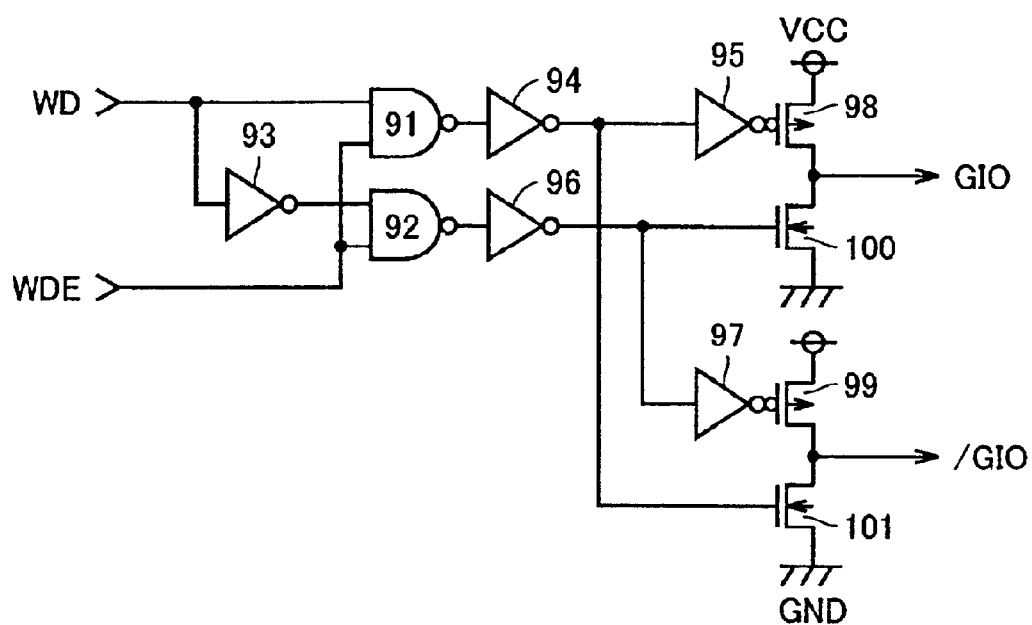
FIG. 21 is a circuit block diagram showing a write driver shown in FIG. 20.

Note that although in write gate 70 of FIG. 15, P channel MOS transistors 72 and 74 are connected in series between node N1 and power supply potential VCC line and in addition, P channel MOS transistors 71 and 73 are connected in series between node N2 and power supply potential VCC line, needless to say that the same effect is obtained even if as shown in FIG. 19, P channel MOS transistors 74 and 72 are connected in series between node N1 and power supply potential VCC line and in addition, P channel MOS transistors 73 and 71 are connected in series between node N2 and power supply potential VCC line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of rewriting a data signal, comprising:
    a memory block including plural memory cells arranged in plural rows and plural columns, plural word lines provided correspondingly to said respective plural rows and plural bit line pairs provided correspondingly to said plural columns;
    sense amplifiers, provided correspondingly to respective bit line pairs, and each amplifying a potential difference occurring between a corresponding bit line pair;
    a row decoder selecting one word line of said plural word lines according to a row address signal to activate memory cells corresponding to said one word line;
    a column decoder selecting one bit line of said plural bit line pairs according to a column address signal;
    a read data line pair provided commonly to said plural bit line pairs;
    a write data line pair provided commonly to said plural bit line pairs;
    a read circuit, connected to one ends of said read data line pair, and for reading a data signal;
    a write circuit, connected to one ends of said write data line pair, and for writing a data signal; and
    an input/output control circuit, coupling a bit line pair selected by said column decoder and the other ends of said read data line pair with each other in read operation, and coupling a bit line pair selected by said column decoder and the other ends of said write data pair with each other in write operation,
    wherein said input/output control circuit includes:
        first and second transistors, provided to each bit line pair, and whose input electrodes are connected to first and second bit lines, respectively, included in a corresponding bit line pair;
        a first switch circuit, provided to each bit line pair, and connecting corresponding first and second transistors between each of first and second read data lines, respectively, included in said read data line pair and a line of a first reference potential in response to selection of a corresponding bit line pair by said column decoder in read operation;
        third and fourth transistors, provided to each bit line pair, and whose input electrodes are connected to first and second write data lines, respectively, included in said write data line pair; and
        a second switch circuit, provided to each bit line pair, and connecting corresponding third and fourth transistors between each of first and second bit lines, respectively, included in a corresponding bit line pair and a line of a second reference potential in response to selection of a corresponding bit line pair by said column decoder in write operation.

2. The semiconductor memory device according to claim 1, wherein said first and second transistors are each an N channel MOS transistor and
    said first reference potential is ground potential.

3. The semiconductor memory device according to claim 2, wherein said read circuit includes:
    a precharge circuit charging said first and second read data lines to power supply potential in advance; and
    a read amplifier comparing potentials of said first and second read data lines in magnitude to output a data signal at a logical level corresponding to a result of the comparison.

4. The semiconductor memory device according to claim 1, wherein said third and fourth transistors are each an N channel MOS transistor and
    said second reference potential is ground potential.

5. The semiconductor memory device according to claim 4, wherein said write circuit drives one write data line of first and second write data lines to power supply potential and the other write data line to ground potential, according to a logical level of a write data signal; and
    drives both of said first and second write data lines to ground potential in write mask mode in which rewriting of data is inhibited.

6. The semiconductor memory device according to claim 1, wherein said third and fourth transistors are each a P channel MOS transistor and
    said second reference potential is power supply potential.

7. The semiconductor memory device according to claim 6, wherein said write circuit drives one write data line of said first and second write data lines to power supply potential and the other write data line to ground potential, according to a logical level of a write data signal; and
    drives both of said first and second write data lines to power supply potential in write mask mode in which rewriting of data is inhibited.

* * * * *